(12) United States Patent
Srivastava et al.

(10) Patent No.: US 10,497,610 B2
(45) Date of Patent: Dec. 3, 2019

(54) DUAL PHOTORESIST APPROACH TO LITHOGRAPHIC PATTERNING FOR PITCH REDUCTION

(71) Applicant: GLOBALFOUNDRIES Inc., Grand Cayman (KY)

(72) Inventors: Ravi Srivastava, Clifton Park, NY (US); Sunil K. Singh, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 339 days.

(21) Appl. No.: 15/370,585

(22) Filed: Dec. 6, 2016

(65) Prior Publication Data

US 2018/0158723 A1    Jun. 7, 2018

(51) Int. Cl.
| | |
|---|---|
| *G03F 7/09* | (2006.01) |
| *H01L 21/768* | (2006.01) |
| *H01L 21/027* | (2006.01) |
| *H01L 21/033* | (2006.01) |
| *G03F 7/004* | (2006.01) |
| *G03F 7/095* | (2006.01) |
| *G03F 7/40* | (2006.01) |

(52) U.S. Cl.
CPC ...... *H01L 21/76816* (2013.01); *G03F 7/0043* (2013.01); *G03F 7/094* (2013.01); *G03F 7/095* (2013.01); *G03F 7/40* (2013.01); *H01L 21/0274* (2013.01); *H01L 21/0337* (2013.01)

(58) Field of Classification Search
CPC ... G03F 7/094; G03F 7/0042; H01L 21/0337; H01L 21/76877; H01L 21/311; H01L 21/31144
USPC .......................................... 430/273.1, 271.1
See application file for complete search history.

(56) References Cited

U.S. PATENT DOCUMENTS

| | | | |
|---|---|---|---|
| 7,820,550 B2 | 10/2010 | Nyhus et al. | |
| 8,835,100 B2 | 9/2014 | Yang | |
| 9,097,975 B2 | 8/2015 | Yang | |
| 2004/0170916 A1* | 9/2004 | Kouchiyama | B82Y 10/00 430/270.1 |
| 2009/0117491 A1* | 5/2009 | Hendel | G03F 7/203 430/296 |
| 2014/0342564 A1* | 11/2014 | Lu | G03F 1/20 438/703 |

FOREIGN PATENT DOCUMENTS

WO    2015084523 A1    6/2015

OTHER PUBLICATIONS

"Multiple Patterning", World Heritage Encyclopedia, Copyright 2016 (17 pages).

* cited by examiner

*Primary Examiner* — Daborah Chacko-Davis
(74) *Attorney, Agent, or Firm* — Thompson Hine LLP; Anthony Canale

(57) ABSTRACT

Methods of lithographic patterning a dielectric layer. A first resist layer is formed on a hardmask layer, and a second resist layer is formed on the first resist layer. The second resist layer is patterned to form a first opening, which is transferred from the second resist layer to the first resist layer. The second resist layer is removed from the first resist layer after the first opening is transferred from the second resist layer to the first resist layer. The first resist layer is patterned to form a second opening laterally displaced in the first resist layer from the first opening. The first resist layer is comprised of a metal oxide photoresist that is removable selective to the hardmask layer. The hardmask layer and the dielectric layer may be subsequently patterned using first resist layer.

19 Claims, 3 Drawing Sheets

DUAL PHOTORESIST APPROACH TO LITHOGRAPHIC PATTERNING FOR PITCH REDUCTION

BACKGROUND

The present invention relates to integrated circuits and semiconductor device fabrication and, more specifically, to methods of lithographically patterning a dielectric layer.

A back-end-of-line (BEOL) interconnect structure may be used to electrically couple device structures fabricated on a substrate during front-end-of-line (FEOL) processing. The BEOL interconnect structure may be formed using a dual-damascene process in which via openings and trenches etching in a dielectric layer are simultaneously filled with metal to create a metallization level. In a via-first, trench-last dual damascene process in which via openings are formed in a dielectric layer and then a trench is formed in the dielectric layer above the via openings, the via openings are unfilled during the etching process forming the trenches. In a single-damascene process, the via openings and trench are formed in different dielectric layers and filled separately with metal.

Dry etch processes are commonly used to fabricate trenches and vias during dual-damascene processing involving copper and a low-k dielectric material. As the semiconductor device technology node advances to smaller dimensions, the decreasing size of semiconductor devices increased the difficulty of controlling the profile of vias and trenches. Hardmasks comprised of a metal, such as titanium nitride (TiN), have been employed to improve etch selectivity to low-k dielectric materials and, thereby, to improve profile control. As feature sizes shrink in advanced semiconductor device technology nodes, the ability to form features in a low-k dielectric material with multi-patterning techniques and a metal hardmask becomes increasingly more challenging.

Improved methods of lithographically patterning a dielectric layer are needed.

SUMMARY

According to an embodiment of the invention, a method includes forming a first resist layer on a hardmask layer, forming a second resist layer on the first resist layer, patterning the second resist layer to form a first opening, and transferring the first opening from the second resist layer to the first resist layer. The method further includes removing the second resist layer from the first resist layer after the first opening is transferred from the second resist layer to the first resist layer. The first resist layer is patterned to form a second opening laterally displaced in the first resist layer from the first opening. The first resist layer is comprised of a metal oxide photoresist that is removable selective to the hardmask layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
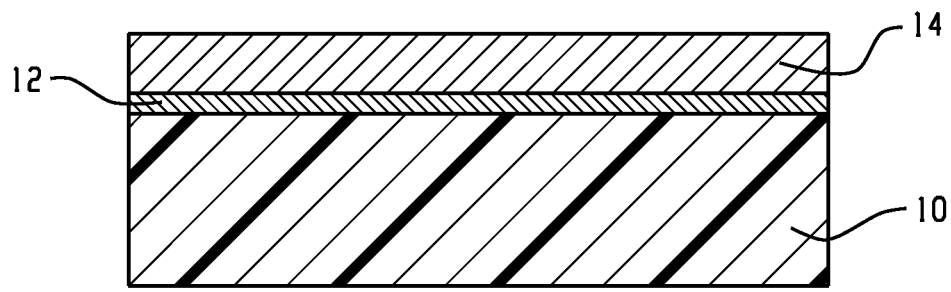
FIGS. 1-7 are cross-sectional views at successive fabrication stages of a processing method in accordance with embodiments of the invention.

With reference to FIG. 1 and in accordance with embodiments of the invention, a dielectric layer 10 is processed according to embodiments of the processing method to form an interconnect structure of a metallization level. The dielectric layer 10 may be formed on a substrate (not shown) comprised of, for example, a semiconductor material suitable for forming an integrated circuit and including device structures fabricated by front-end-of-line (FEOL) processing to form the integrated circuit. The dielectric layer 10 may be composed of an electrically-insulating dielectric material, such as silicon dioxide ($SiO_2$) or a low-k dielectric material with a dielectric constant (e.g., a permittivity) less than the dielectric constant of silicon dioxide.

A hardmask layer 12 is formed as a sacrificial film on a top surface of the dielectric layer 10. The hardmask layer 12 may be constituted by a dielectric material, such as silicon dioxide ($SiO_2$) or silicon nitride ($Si_3N_4$), deposited by chemical vapor deposition (CVD).

A resist layer 14 is formed as a sacrificial film on the hardmask layer 12. The material constituting the resist layer 14 may be a metal oxide photoresist, also known as a molecular organometallic photoresist. A metal oxide photoresist can be directly patterned using an exposure source, such as an extreme ultraviolet (EUV) exposure source, and can be etched with a higher selectivity than organic films, such as a conventional organic photoresist. The metal oxide photoresist may include molecular or organometallic compounds that utilize metal centers with a high EUV optical density. A metal oxide photoresist may include an inorganic metal oxide core of, for example, zirconium dioxide ($ZrO_2$) or hafnium oxide ($HfO_2$), an organic ligand shell composed of, for example, carboxylic or sulfonic acid, and a photoreactive compound needed to promote imaging. The metal oxide photoresist of the resist layer 14 may be chemically developed as a positive tone resist if, for example, it has an aqueous base. The metal oxide photoresist of the resist layer 14 may be chemically developed as a negative tone resist if, for example, it has an organic base, such as 2-heptanone. The metal oxide photoresist of the resist layer 14 is not chemically amplified, which eliminates the potential negative impact of acid over-diffusion on critical dimension (CD) control.

Figure 2:
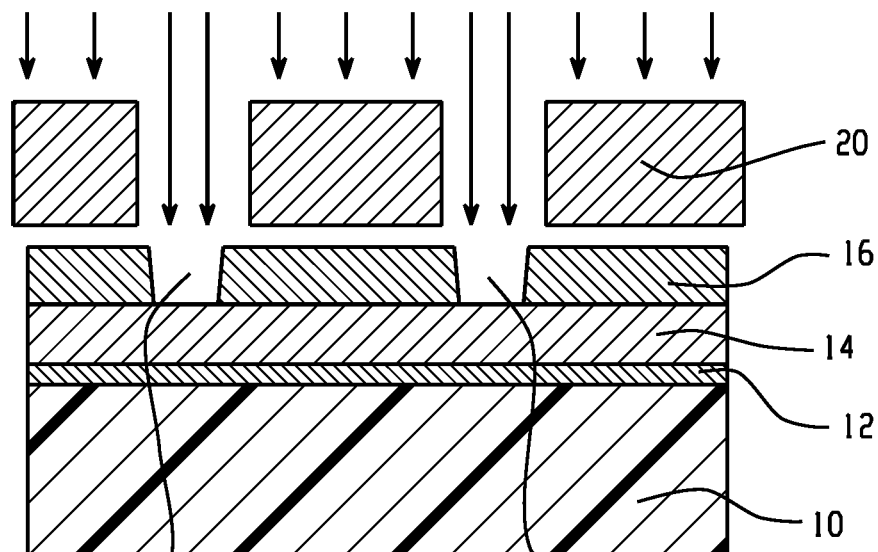

With reference to FIG. 2 in which like reference numerals refer to like features in FIG. 1 and at a subsequent fabrication stage, a resist layer 16 is formed as a sacrificial film on the resist layer 14 and patterned to form openings 18. Specifically, the resist layer 16 may be composed of an organic photoresist that is applied by spin-coating, pre-baked, exposed to a pattern of radiation from an exposure source projected through a photomask 20, baked after exposure, and developed with a chemical developer to form the openings 18 situated at the intended locations for corresponding openings to be formed in the resist layer 14. The openings 18 formed in the resist layer 16 are subsequently transferred from the resist layer 16 to the resist layer 14.

In the representative embodiment, the resist layer 16 is formed from a positive tone organic photoresist. A positive tone organic photoresist is a type of photoresist in which locations of the resist layer 16 that are exposed to radiation projected through the photomask 20 become soluble to the chemical developer. The openings 18 are defined at these soluble locations when the exposed resist layer 16 is developed. Unexposed locations of the resist layer 16 remain insoluble to the chemical developer.

Figure 3:
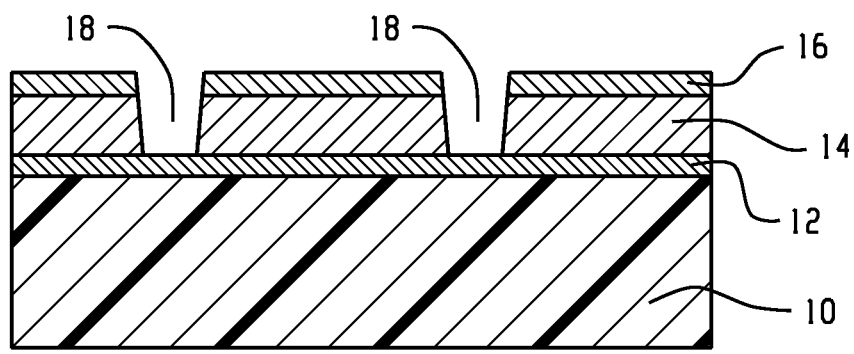

With reference to FIG. 3 in which like reference numerals refer to like features in FIG. 2 and at a subsequent fabrication stage, the resist layer 14 may be removed at the locations of the openings 18 by an etching process using an etch chemistry selected to remove the constituent material of the resist layer 14 selective to the constituent material of the hardmask layer 12. As used herein, the term "selective" in reference to a material removal process (e.g., etching) denotes that the material removal rate (i.e., etch rate) for the targeted material is higher than the material removal rate (i.e., etch rate) for at least another material exposed to the material removal process. The openings 18 are extended by the etching process from the top surface of the resist layer 14 vertically through the resist layer 14 to the top surface of the hardmask layer 12. The resist layer 16 is stripped by, for example, ashing after the openings 18 are extended through the resist layer 14.

Figure 4:
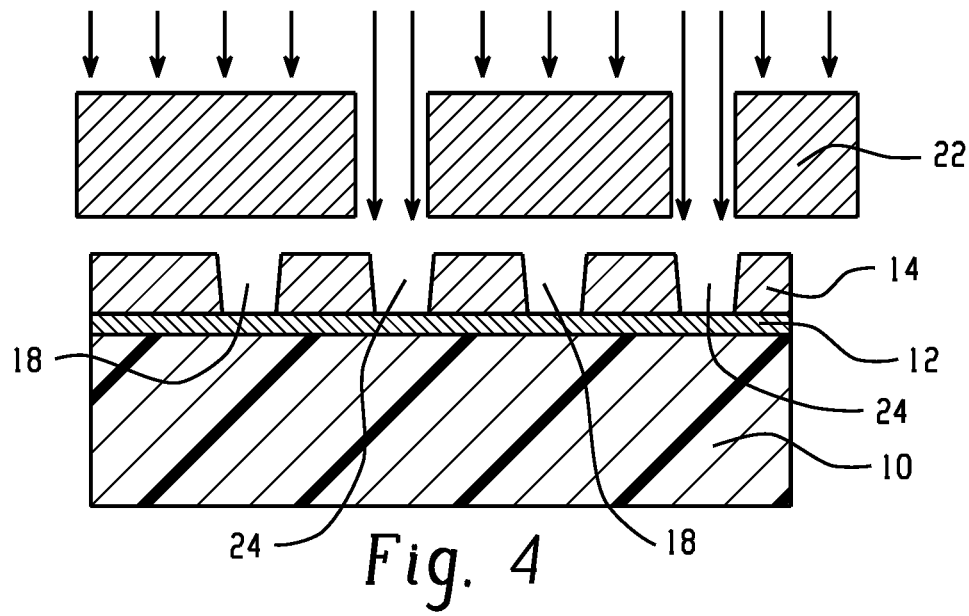

With reference to FIG. 4 in which like reference numerals refer to like features in FIG. 3 and at a subsequent fabrication stage, the resist layer 14 is exposed to a pattern of radiation from an exposure source projected through a photomask 22 and developed with a chemical developer to form openings 24 situated at the intended locations for corresponding openings to be formed in the hardmask layer 12 and dielectric layer 10. In the representative embodiment, the resist layer 14 is formed from a positive tone metal oxide photoresist. A positive tone metal oxide photoresist is a type of photoresist in which locations of the photoresist that are exposed to radiation projected through the photomask 22 become soluble to the chemical developer. The openings 24 are defined at these soluble locations when the exposed resist layer 14 is developed. Unexposed locations of the resist layer 14 remain insoluble to the chemical developer. The resist layer 14 now includes the openings 18 transferred from the resist layer 14 and the openings 24 that are photolithograpically formed, and the openings 18, 24 are subsequently transferred from the resist layer 14 to the hardmask layer 12 and the dielectric layer 10.

In an embodiment, the photomask 22 is a different photomask that is distinct from the photomask 20. In an alternative embodiment, photomask 22 and photomask 20 may be the same photomask that is repositioned through a lateral shift and used to expose the resist layer 14 as part of the process forming openings 24.

Figure 5:
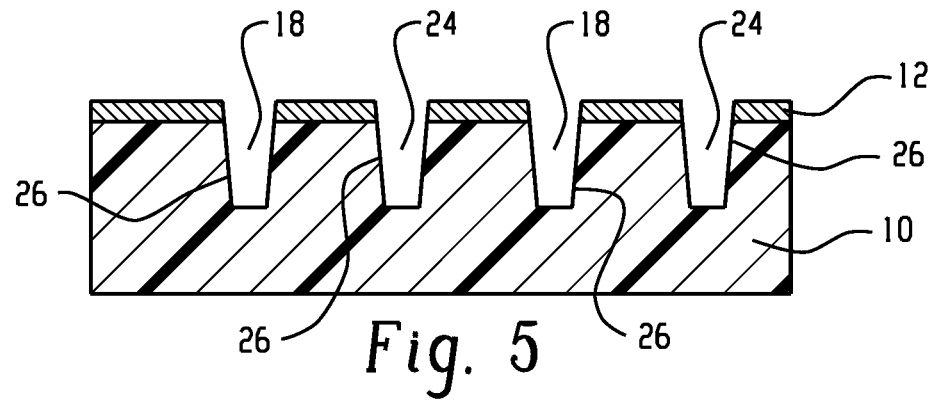

With reference to FIG. 5 in which like reference numerals refer to like features in FIG. 4 and at a subsequent fabrication stage, the hardmask layer 12 is subsequently etched at the locations of the openings 18, 24 in the resist layer 14 by an etching process. The etch chemistry of the etching process is chosen to remove the constituent material of the hardmask layer 12 selective to the materials of the resist layer 14 and the dielectric layer 10. The openings 18, 24 are extended simultaneously by the etching process vertically through the hardmask layer 12 to the top surface of the dielectric layer 10. The resist layer 14 functions as an etch mask during the etching process patterning the hardmask layer 12 to simultaneously form the openings 18, 24, and the dielectric layer 10 functions as an etch stop.

The resist layer 14 is removed using either a dry or wet cleaning process having a suitable etch chemistry. Because the resist layer 14 is composed of a metal oxide photoresist, the resist layer 14 may be removed more easily than a metal hardmask comprised of, for example, titanium nitride (TiN).

The dielectric layer 10 is etched at the locations of the openings 18, 24 in the hardmask layer 12 by an etching process using an etch chemistry selected to form trenches 26. The etching process removes the constituent material of the dielectric layer 10 selective to the material of the hardmask layer 12. The trenches 26 have a given depth of penetration from the top surface of the dielectric layer 10 into the dielectric layer 10. The hardmask layer 12 functions as an etch mask during the etching process patterning the dielectric layer 10 to form the trenches 26 at the locations of the openings 18, 24. The etching process used to etch the dielectric layer 10 may comprise a wet chemical etching process or a dry etching process, such as reactive-ion etching (RIE), and may be timed to provide the given depth of penetration.

The trenches 26 in the dielectric layer 10 represent features having a fine pitch due to the multiple-patterning approach with dual photoresists used by the fabrication process. In an embodiment, one of the photoresists is a metal oxide photoresist and the other of the photoresists is an organic photoresist. In embodiments, the metal oxide photoresist is located between the organic photoresist and the dielectric layer 10.

Figure 6:
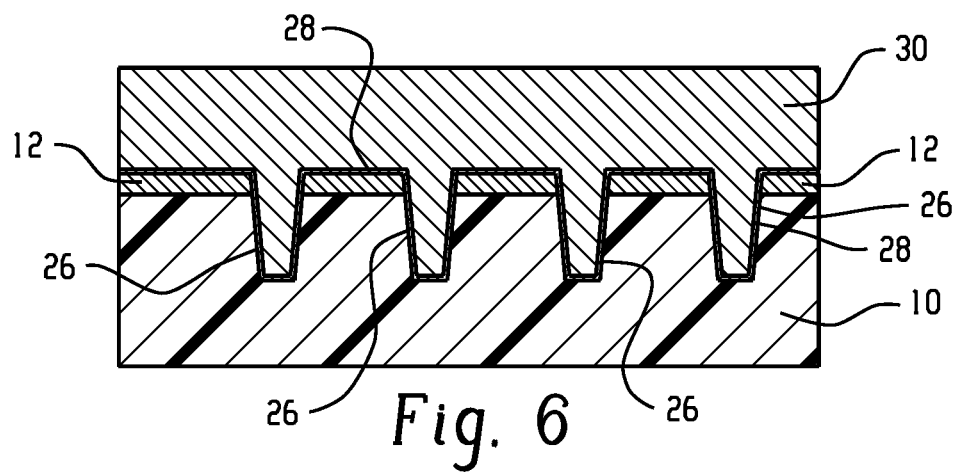

With reference to FIG. 6 in which like reference numerals refer to like features in FIG. 5 and at a subsequent fabrication stage, a barrier/liner layer 28 of a given thickness is deposited on the sidewalls and base of the trenches 26 in the dielectric layer 10, and is also deposited in the field area on the top surface of the dielectric layer 10. The barrier/liner layer 28 may be comprised of titanium (Ti), titanium nitride (TiN), tantalum (Ta), tantalum nitride (TaN), or a layered combination of these materials (e.g., a TaN/Ta bilayer) deposited by physical vapor deposition (PVD) with, for example, a sputtering process or by atomic layer deposition (ALD). A seed layer (not shown) may be formed that covers the barrier/liner layer 28 inside the openings 18, 24 and that also covers the top surface of the hardmask layer 12 and dielectric layer 10 in the field area. The seed layer may be comprised of elemental copper (Cu) that is deposited by PVD with, for example, a sputtering process. After the deposition of the seed layer, a metal layer 30 comprised of a low-resistivity metal, such as copper (Cu), may be deposited using a deposition process, such as electroplating or another electrochemical plating process. The seed layer, which is thinner than the metal layer 30, may be required to carry the electrical current needed to perform an electroplating process forming the metal layer 30. Alternatively, the metal layer 30 may be deposited with an electroless deposition process, which would permit the seed layer to be omitted.

Figure 7:
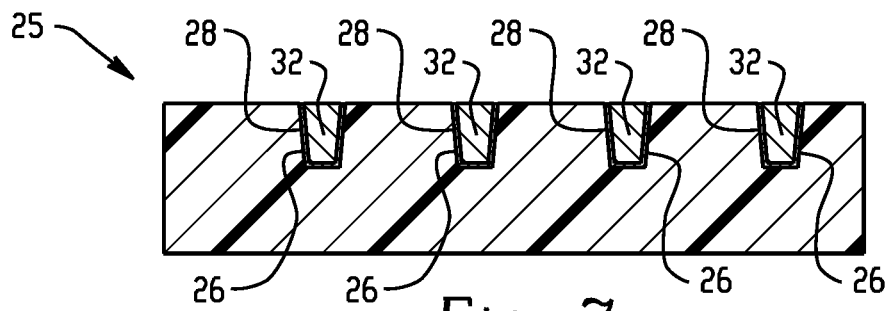

With reference to FIG. 7 in which like reference numerals refer to like features in FIG. 6 and at a subsequent fabrication stage, the metal layer 30, the seed layer, the barrier/liner layer 28, and the hardmask layer 12 are removed from the field area on the top surface of dielectric layer 10 by planarization, such as with one or more CMP processes. Each CMP process may be conducted with a commercial tool using polishing pads and slurries selected to polish the targeted material. Following planarization, a metallization level 25 of an interconnect structure includes portions 32 of the metal layer 30 that are located inside the openings 18, 24. These portions 32 may represent wires in trenches serving as the openings 18, 24, via plugs in vias serving as the openings 18, 24, or contacts in contact holes serving as the openings 18, 24. Each of these structures may be used in an interconnect structure to couple devices of an integrated circuit, to provide circuit-to-circuit connections, and/or to communicate signals to and from I/O terminals.

Figure 8:
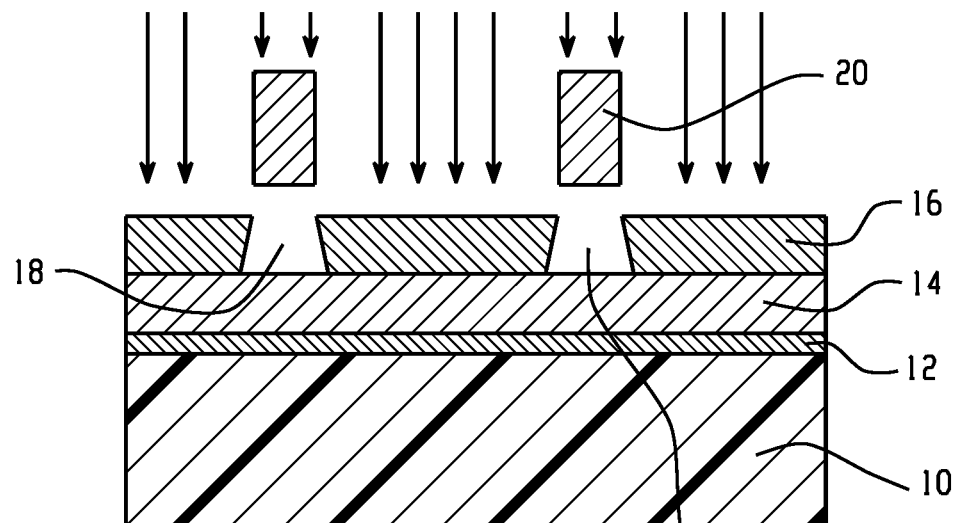
FIG. 8 is a cross-sectional view similar to FIG. 2 of a fabrication stage of a processing method in accordance with alternative embodiments of the invention.

With reference to FIG. 8 in which like reference numerals refer to like features in FIG. 2 and in accordance with alternative embodiments, the resist layer 16 may be formed from an organic material that is a negative tone photoresist, instead of a positive tone photoresist. A negative tone photoresist is a type of photoresist in which locations of the resist layer 16 that are exposed to radiation projected through the photomask 20 become insoluble to the chemical developer. Unexposed locations of the resist layer 16 are dissolved by the chemical developer to define the openings 18. The photomask 20 may be adjusted to adapt the exposure to the use of a negative tone photoresist. Processing may continue as described in the context of FIGS. 3-7.

Figure 9:
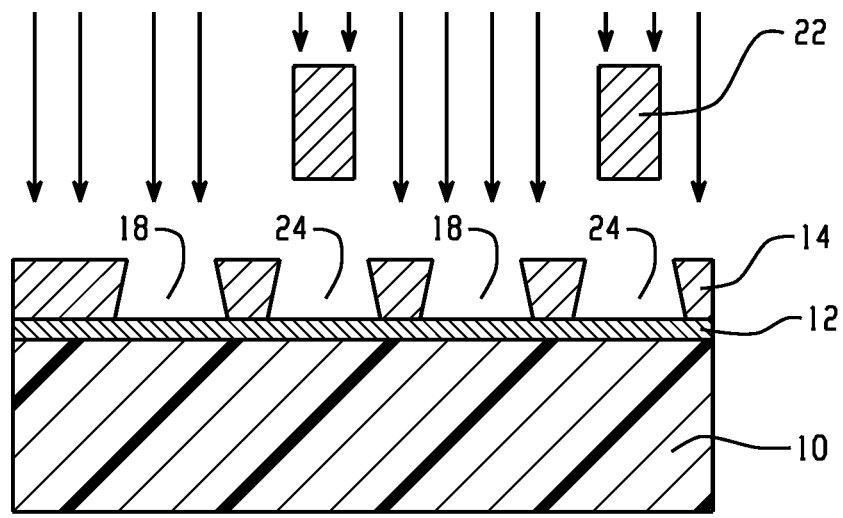
FIG. 9 is a cross-sectional view similar to FIG. 4 of a fabrication stage of a processing method in accordance with alternative embodiments of the invention.

With reference to FIG. 9 in which like reference numerals refer to like features in FIG. 4 and in accordance with alternative embodiments, the resist layer 14 may be a negative tone metal oxide photoresist, instead of a positive tone metal oxide photoresist. A negative tone metal oxide photoresist is a type of photoresist in which the locations of the resist layer 14 that are exposed to radiation projected through the photomask 22 become insoluble to the chemical developer. Unexposed locations of the resist layer 14 are dissolved by the chemical developer to define the openings 24. The photomask 22 may be adjusted to adapt the exposure to the use of a negative tone metal oxide photoresist. Processing may continue as described in the context of FIGS. 5-7.

Additional combinations of resist types may be used. In an embodiment, the resist layer 14 may be formed from a negative tone metal oxide photoresist and the resist layer 16 may be formed from a negative tone organic photoresist. In another embodiment, the resist layer 14 may be formed from a negative tone metal oxide photoresist and the resist layer 16 may be formed from a positive tone organic photoresist. In yet another embodiment, the resist layer 14 may be formed from a positive tone metal oxide photoresist and the resist layer 16 may be formed from a negative tone organic photoresist.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a first resist layer on a hardmask layer;
   forming a second resist layer on the first resist layer;
   patterning the second resist layer to form a first opening;
   transferring the first opening from the second resist layer to the first resist layer;
   after the first opening is transferred from the second resist layer to the first resist layer, removing the second resist layer from the first resist layer; and
   after the second resist layer is removed from the first resist layer, patterning the first resist layer to form a second opening laterally displaced in the first resist layer from the first opening,
   wherein the first resist layer is comprised of a metal oxide resist material that is removable selective to the hardmask layer.

2. The method of claim 1 wherein the metal oxide resist material of the first resist layer is a positive tone metal oxide resist.

3. The method of claim 2 wherein the second resist layer is a positive tone photoresist.

4. The method of claim 2 wherein the second resist layer is a negative tone photoresist.

5. The method of claim 1 wherein the metal oxide resist material of the first resist layer is a negative tone metal oxide resist.

6. The method of claim 5 wherein the second resist layer is a positive tone photoresist.

7. The method of claim 5 wherein the second resist layer is a negative tone photoresist.

8. The method of claim 1 wherein the second resist layer is an organic photoresist.

9. The method of claim 1 wherein patterning the second resist layer to form the first opening comprises:
   exposing the second resist layer to radiation projected through a photomask.

10. The method of claim 9 wherein said patterning the first resist layer to form the second opening laterally displaced in the first resist layer from the first opening comprises:
    after the second resist layer is removed from the first resist layer, exposing the first resist layer to radiation projected through the photomask; and
    after the first resist layer is exposed to the radiation projected through the photomask, developing the first resist layer to form the second opening.

11. The method of claim 1 wherein said transferring the first opening from the second resist layer to the first resist layer comprises:

etching the first resist layer to transfer the first opening from the second resist layer to the first resist layer.

12. The method of claim 11 wherein said patterning the first resist layer to form the second opening laterally displaced in the first resist layer from the first opening comprises:
exposing the first resist layer to radiation projected through a photomask; and
after the first resist layer is exposed to the radiation projected through the photomask, developing the first resist layer to form the second opening.

13. The method of claim 1 further comprising:
transferring the first opening and the second opening from the first resist layer to the hardmask layer to form a third opening and a fourth opening in the hardmask layer.

14. The method of claim 13 wherein the hardmask layer is located on a dielectric layer, and further comprising:
transferring the third opening and the fourth opening from the hardmask layer into the dielectric layer to form a plurality of openings in the dielectric layer; and
filling the plurality of openings in the dielectric layer with a metal to form a plurality of conductive features.

15. The method of claim 14 further comprising:
before the plurality of openings in the dielectric layer are filled with the metal, removing the first resist layer from the hardmask layer.

16. The method of claim 14 further comprising:
after the plurality of openings in the dielectric layer are filled with the metal, removing the hardmask layer from the dielectric layer.

17. The method of claim 13 wherein the first opening and the second opening are concurrently transferred from the first resist layer into the hardmask layer.

18. The method of claim 13 further comprising:
after the first opening and the second opening are transferred from the first resist layer to the hardmask layer, removing the first resist layer from the hardmask layer.

19. The method of claim 1 wherein patterning the first resist layer to form the second opening laterally displaced in the first resist layer from the first opening comprises:
exposing the first resist layer to radiation projected through a photomask; and
after the first resist layer is exposed to the radiation projected through the photomask, developing the first resist layer to form the second opening.

* * * * *